(12) United States Patent
Huang et al.

(10) Patent No.: US 9,714,979 B2
(45) Date of Patent: *Jul. 25, 2017

(54) CONTACTLESS SIGNAL TESTING (71) Applicant: TAIWAN SEMICONDUCTOR MANUFACTURING COMPANY, LTD., Hsin-Chu (TW)

(72) Inventors: Bo-Jr Huang, Tainan (TW); Nan-Hsin Tseng, Tainan (TW); Yen-Ling Liu, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/243,521

(22) Filed: Aug. 22, 2016

(65) Prior Publication Data
US 2016/0356845 A1 Dec. 8, 2016

Related U.S. Application Data (63) Continuation of application No. 14/095,389, filed on Dec. 3, 2013, now Pat. No. 9,423,452.

(51) Int. Cl.
*G01R 31/305* (2006.01)
*G01R 31/307* (2006.01)
*G01R 1/07* (2006.01)
*G01R 31/302* (2006.01)

(52) U.S. Cl.
CPC .......... *G01R 31/307* (2013.01); *G01R 1/07* (2013.01); *G01R 31/3025* (2013.01)

(58) Field of Classification Search
CPC .................. G01R 31/307; G01R 1/07
See application file for complete search history.

(56) References Cited

U.S. PATENT DOCUMENTS

| 5,391,909 | A | 2/1995 | Ozdemir |
| 5,781,017 | A | 7/1998 | Cole |
| 6,175,124 | B1 | 1/2001 | Cole |
| 7,084,664 | B1 | 8/2006 | Lee |
| 2005/0029661 | A1 | 2/2005 | Vallet |
| 2012/0007635 | A1 | 1/2012 | Hironaka |

OTHER PUBLICATIONS

Jensen et al., Use of E-Beam for Random Access Read and Write of Digital Test Signals, 1984 IEEE Int'l. Solid-State Circuits Conf., pp. 22-23, 310.*

* cited by examiner

*Primary Examiner* — Daniel Miller
(74) *Attorney, Agent, or Firm* — Haynes and Boone, LLP (57) ABSTRACT

A method for performing contactless signal testing includes receiving, with a testing pad of an integrated circuit, a signal within a beam. The method further includes converting, with a number of diodes connected to a positive voltage supply, an electrical current signal created by the electron beam to a voltage signal, wherein the number of diodes includes a diode stack of multiple diodes. The method further includes extracting, with a digital inverter, a test signal from the voltage signal.

20 Claims, 7 Drawing Sheets

CONTACTLESS SIGNAL TESTING

PRIORITY INFORMATION

The present application is a continuation of U.S. patent application Ser. No. 14/095,389, filed Dec. 3, 2013, and entitled "Contactless Signal Testing," the disclosure of which is hereby incorporated by reference in its entirety.

BACKGROUND

Integrated circuits include multiple intricate components that must be tested for compliance with design specifications. This is often done by applying a test signal to the digital circuitry within the integrated circuit to make sure that the circuitry performs as desired. The test signal is typically applied to a bonding pad on the integrated circuit.

Bonding pads are used to connect an integrated circuit to external devices and circuits. Thus, the bonding pads provide a conductive path to the digital circuitry within the integrated circuit. Bonding pads may be sensitive to damage from external probes. Thus, the probes used to apply the testing signal can potentially damage the bonding pads, thereby making the circuit unusable.

Damaged bonding pads can be especially wasteful with integrated circuits that include multiple wafers stacked on top of each other. For example, some three dimensional circuit technology involves bonding multiple circuits formed on separate wafers to each other. With such technologies, the circuit on each wafer is tested individually before it is bonded to another wafer. Thus, if the bonding pads are damaged during the testing, only that wafer can be discarded rather than the entire stack of wafers. But, a final test is still done when all wafers have been bonded to each other. If the bonding pad on the stack of wafers is damaged during testing, the entire stack of wafers may have to be discarded. Accordingly, it would be desirable to have a testing method that would involve less risk of damaging the bonding pads of an integrated circuit.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in, direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
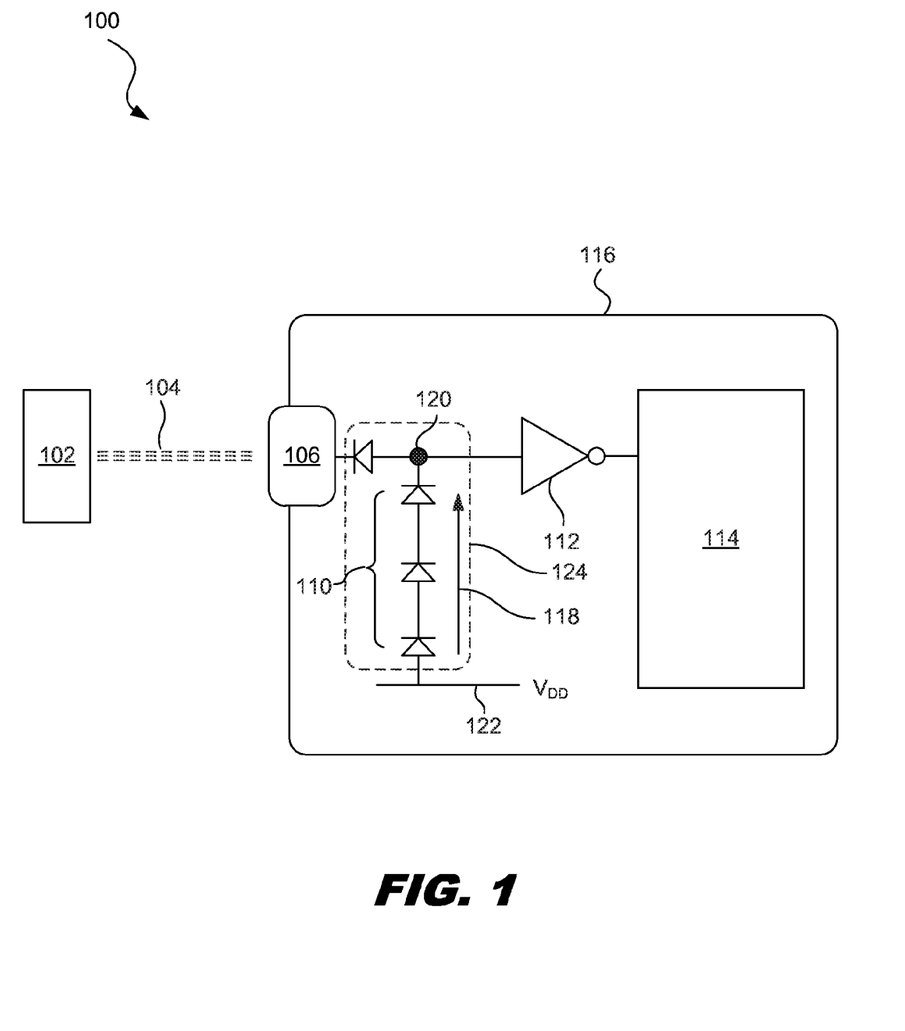
FIG. 1 is a diagram showing an illustrative integrated circuit allowing for contactless testing, according to one example of principles described herein.

FIG. 1 is a diagram showing an illustrative integrated circuit allowing for contactless testing. According to the present example, the contactless testing system 100 includes a transmitter 102 that transmits an electron beam 104 to a testing pad 106. The testing pad 106 is connected to a current-to-voltage converter 124 that may include a number of diodes 110. Based on the voltage created at the current-to-voltage converter 124, a digital inverter 112 can be used to output either a digital high or digital low signal. The inverter 112 is then connected to digital circuitry 114 within the integrated circuit 116 to be tested.

The electron beam 104 is produced by an electron beam transmitter 104. The transmitter 102 can be placed near the testing pad 106 but not make actual contact with the testing pad 106. Thus, the electrons within the electron beam 104 are projected to the testing pad 106. The electron beam 104 can be turned on an off to embed a digital signal within the electron beam 104. The rate at which the electron beam 104 is turned on and off can be adjusted in order to project the digital test signal at the desired frequency.

The testing pad 106 may be an electrically conductive pad designed to receive the electrons from the electron beam 104. Because there is no physical contact between the transmitter 102 and the testing pad 106, the testing pad 106 does not have to be large enough to allow for a strong flow of electricity across a physical contact. In some examples, the size of the testing pad 106 may be within a range of about 0.80-1.20 square micrometers.

After the electrons from the electron beam 104 reach the testing pad 106, they will flow to a node 120 through a first diode 124. From that node 120, the electrons will flow through a number of diodes 110 that are connected between the node 120 and a positive voltage supply, $V_{DD}$ (122). Integrated circuits typically include a positive voltage supply line 122 and a negative voltage supply line that are used for the various digital components within the integrated circuit. Because electrons will flow towards a positive voltage, they will be drawn towards the positive voltage supply 122.

The flow of electrons across the diodes 110 will produce an electric current 118 in the opposite direction. This electric current will, in turn, change a voltage level at the node. If that voltage level is high enough, it will trip the inverter 112 so that the output of the inverter 112 will be a digital high signal instead of a digital low signal. A digital inverter 112 is a digital circuit component that produces a high signal when the input is a low signal. Conversely, the inverter 112 produces a high signal when the input is a low signal.

The input required to trip the inverter 112 may be based on the design specifications of the inverter 112. Likewise, the amount of current required to produce the desired voltage needed to trip the inverter 112 may be based on design specifications of the diodes 110. In general, a larger number of diodes 110 will make it so that less current is required to trip the inverter 112. But, a larger number of diodes 110 may take up more space on the integrated circuit 116. A design with a larger number of diodes 110 may be more problematic in cases where there are hundreds or thousands of independent testing pads 106 on an integrated circuit 116.

The output of the digital inverter 112 represents the original signal embedded within the electron beam 104. Thus, the digital circuitry 114 can be provided with the testing signal without using a probe to make physical contact with the testing pad 106. This reduces the risk of damage to an integrated circuit 116.

Figure 2:
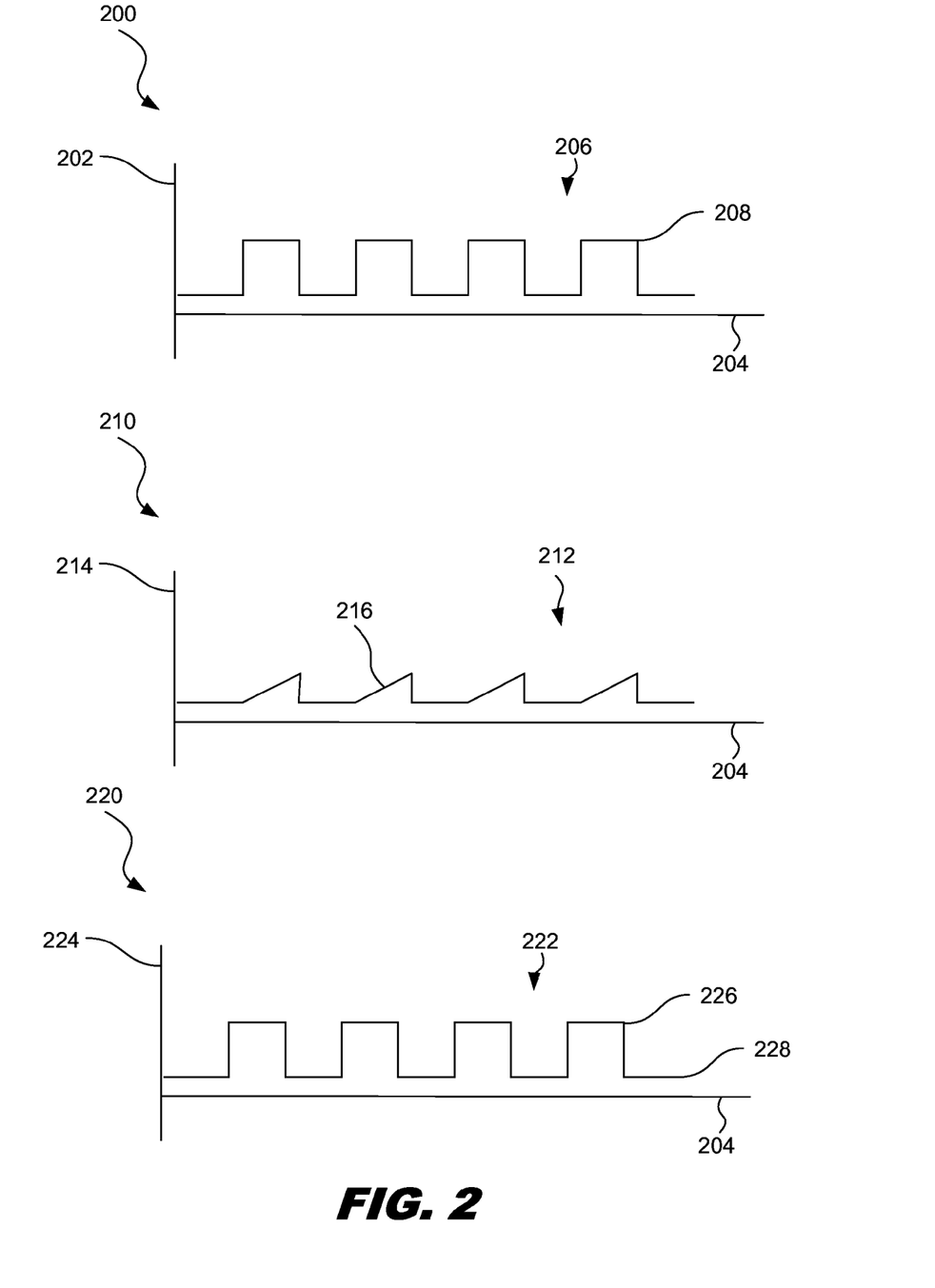
FIG. 2 is a diagram showing illustrative signals associated with contactless testing, according to one example of principles described herein.

FIG. 2 is a diagram showing illustrative signals associated with contactless testing. FIG. 2 illustrates three different signals. The first signal 206 represents the signal embedded in the electron beam. The second signal 212 represents the electric current flowing through the diodes (110, FIG. 1). The third signal 222 represents the signal output of the inverter (112, FIG. 1).

The first signal 206 is represented along a graph 200 wherein the horizontal axis 204 represents time and the vertical axis 202 represents electron flow. The first signal 206 represents a basic clock signal that consistently alternates between a digital high and a digital low. This signal can be produced by turning the electron beam on and off. Specifically, when the electron beam is on, the signal 206 is at a high point 208. Conversely, when the electron beam is off, the signal is at the low point.

The second signal 212 is represented along a graph 210 wherein the horizontal axis 204 represents time and the vertical axis 214 represents electric current. The second signal 212 appears as a saw-tooth signal. The ramp up portions 216 of the second signal 212 correspond to the high points 208 of the first signal 206. Specifically, when the electron beam is on, the electric current flowing through the diodes that are connected to the testing pad will begin to increase. When the electron beam is turned off, the current level in the diodes will sharply drop back down to zero.

The third signal 222 is represented along a graph 220 wherein the horizontal axis 204 represents time and the vertical axis represents voltage 224. The third signal 222 resembles the first signal 206. Specifically, when the electron beam is on in the first signal, the output of the digital inverter is at a high point 226. Conversely, when the electron beam is off, the third signal is at a low point 228.

The third signal 222 may not precisely correspond to the first signal 206. This is because there may be propagation delays and other factors. For example, the electric current will have to ramp up to a certain level before the voltage at the node (120, FIG. 1) is high enough to trip the inverter so that the inverter produces a different output.

Figure 3:
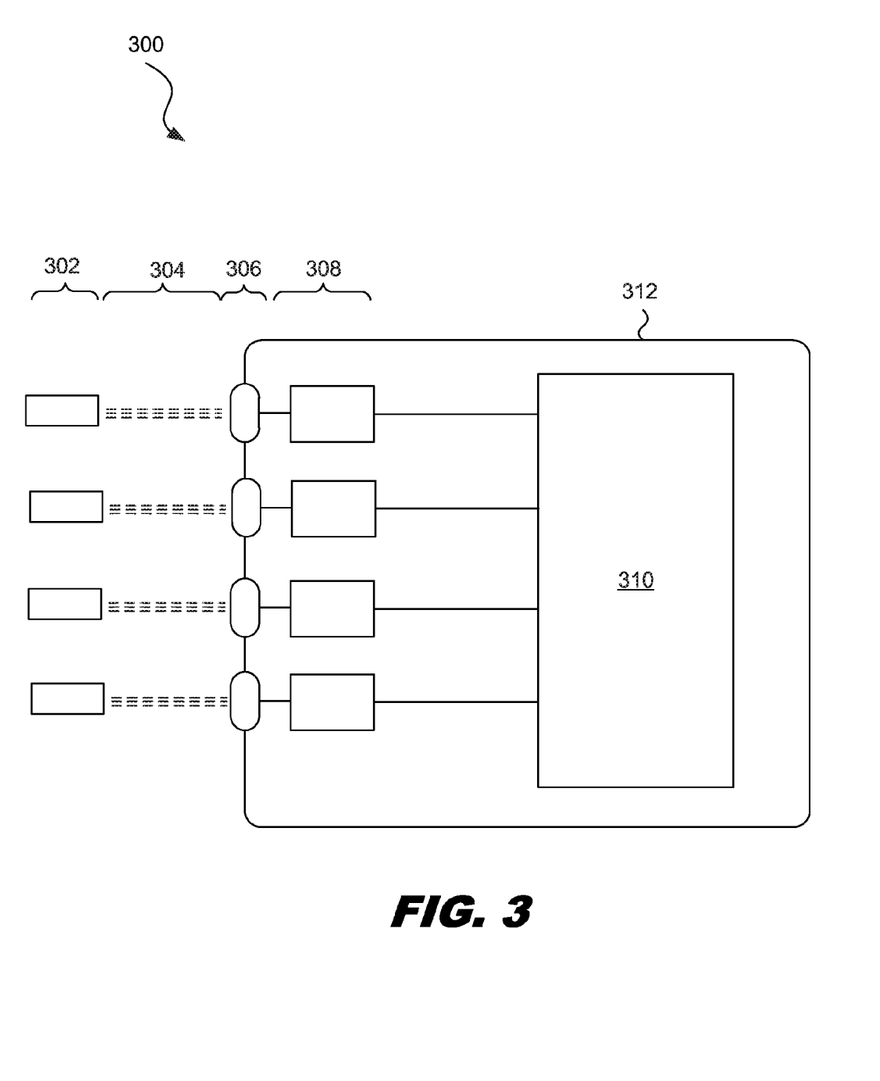
FIG. 3 is a diagram showing an illustrative integrated circuit allowing for contactless testing with multiple channels, according to one example of principles described herein.

FIG. 3 is a diagram showing an illustrative integrated circuit 312 allowing for contactless testing with multiple channels. According to the present example, an integrated circuit may include multiple channels, each channel corresponding to one testing pad. Digital circuitry 310 is often designed to operate with several signal paths at a time. In some integrated circuits there may be hundreds or even thousands of signal paths. Each of these channels should be tested to ensure that the integrated circuit works as designed.

According to the present example, a number of transmitters 302 are arranged to be in alignment with a number of testing pads 306 on the integrated circuit 312. The transmitters each produce an independently controlled electron beam 304. Thus, each of the electron beams 304 may have a different signal embedded therein. This corresponds to real operating conditions of the integrated circuit 312.

After each of the different signals is received by the corresponding testing pads 306, receivers 308 are used to extract the testing signal and send the testing signal to the corresponding digital circuitry 310. A receiver 308 includes the current-to-voltage component as described above. Specifically, the current-to-voltage component may be a diode stack connected between the testing pad 306 and a positive voltage supply.

Figure 4:
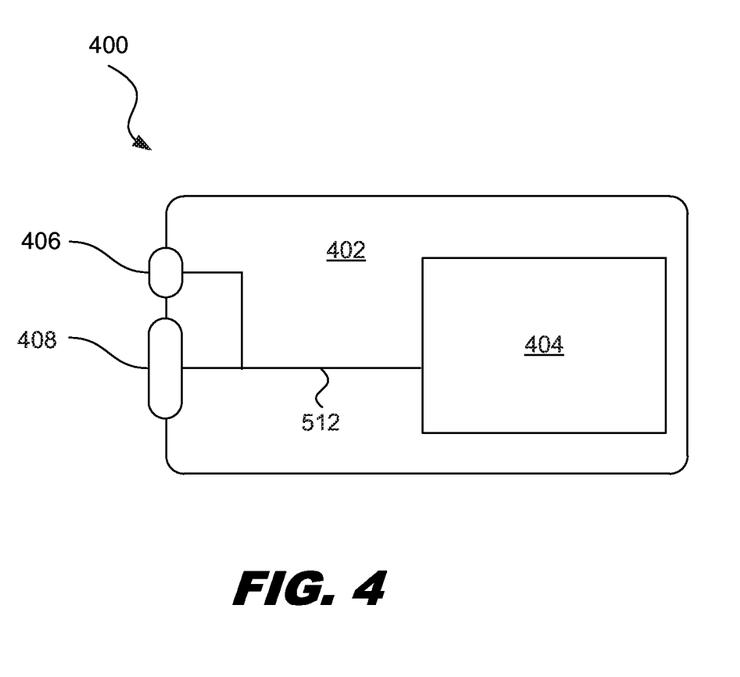
FIG. 4 is a diagram showing an illustrative integrated circuit allowing for contactless testing and separate bonding pads, according to one example of principles described herein.

FIG. 4 is a diagram showing an illustrative integrated circuit 402 allowing for contactless testing and separate bonding pads 408. As described above, a bonding pad 408 and a testing pad 406 may be the same thing. In some cases, however, the bonding pad 408 may be separate from the testing pad 406. But, the testing pad 406 is still connected to the same signal path 412 as the bonding pad 408.

By separating the testing pads 406 from the bonding pads 408, fewer testing pads 406 may be used because one testing pad may connect to multiple bonding pads. In such a system, a multiplexer is used to encode the signal before it is transmitted to the testing pad. A de-multiplexer is then used to de-multiplex the signal and transmit each individual signal to its respective signal path.

Figure 5:
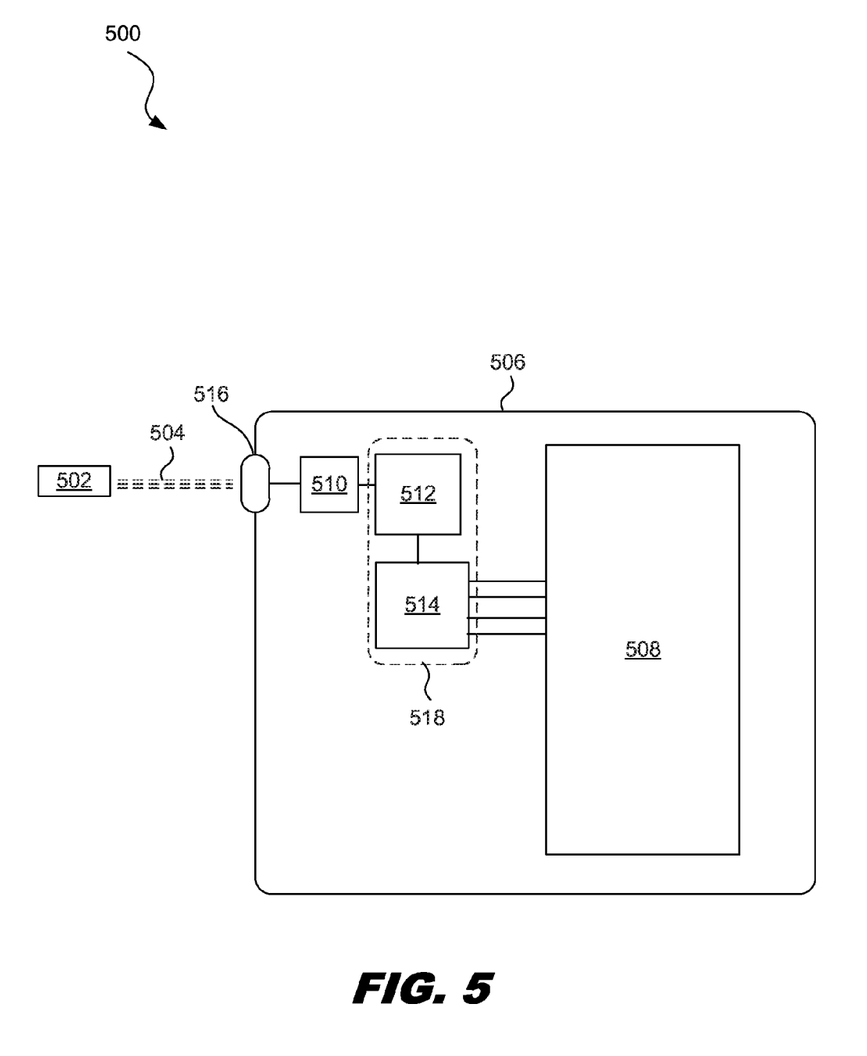
FIG. 5 is a diagram showing an illustrative integrated circuit allowing for contactless testing with a time division multiplexed signal, according to one example of principles described herein.

FIG. 5 is a diagram showing an illustrative integrated circuit allowing for contactless testing with a time division multiplexed signal. According to the present example, the electron beam 502 is configured to transmit a time division multiplexed signal 504 to the testing pad 516. The receiver 510 then transmits the recovered signal to a temporary storage device 512. From there, the signal is de-multiplexed by a de-multiplexer 518 before it is transmitted to the digital circuitry 508 of the integrated circuit 506.

Time division multiplexing works by transmitting multiple signals within various time slots of the main signal. For example, to multiplex four signals into one signal, the main signal is divided into four repeating time slots. During the first time slot, a portion of the first signal is inserted. During the second time slot, a portion of the second signal is inserted. During the third time slot, a portion of the third signal is inserted, Finally, during the fourth time slot, a portion of the fourth signal is inserted. This process is repeated continually during transmission of the signal.

After the main signal is received by the receiver 510, it is passed to the de-multiplexer 518. The de-multiplexer 518 includes a memory component 512 for temporary storage. The memory component 512 acts as a buffer to hold the received data until it can be de-multiplexed by the de-multiplexer 514. In one example, the memory component 512 includes a number of registers. The number of registers may match the number of time slots within the main multiplexed signal. The data stored within the time slots of the main multiplexed signal may be put into each register as it comes in. Specifically, the data within the first time slot may be put in a first register. The data within the second time slot may be put within the second register. The data within the third time slot may be put within the third register, Finally, the data within the fourth time slot may be put within the fourth register.

The de-multiplexer 518 also includes a de-compressor 514. After the registers are full and there is enough data for each of the time slots, the data can be moved to the de-compressor 514 for time decompression. When data is time-division multiplexed, it may be compressed into a more compact format before it is transmitted. The de-compressor 514 will appropriately decompress the data so that it is ready for transmission to the digital circuitry 508.

While the example of FIG. 5 shows a time division multiplexed signal with four channels being embedded into a main signal, other embodiments may have more signals embedded within a main signal. For example, an integrated circuit may have 1000 bonding pads and 20 testing pads. Each testing pad may have 50 different signals multiplexed within using time division multiplexing. Thus, the total number of signals is 1000, which matches the number of bonding pads.

Figure 6:
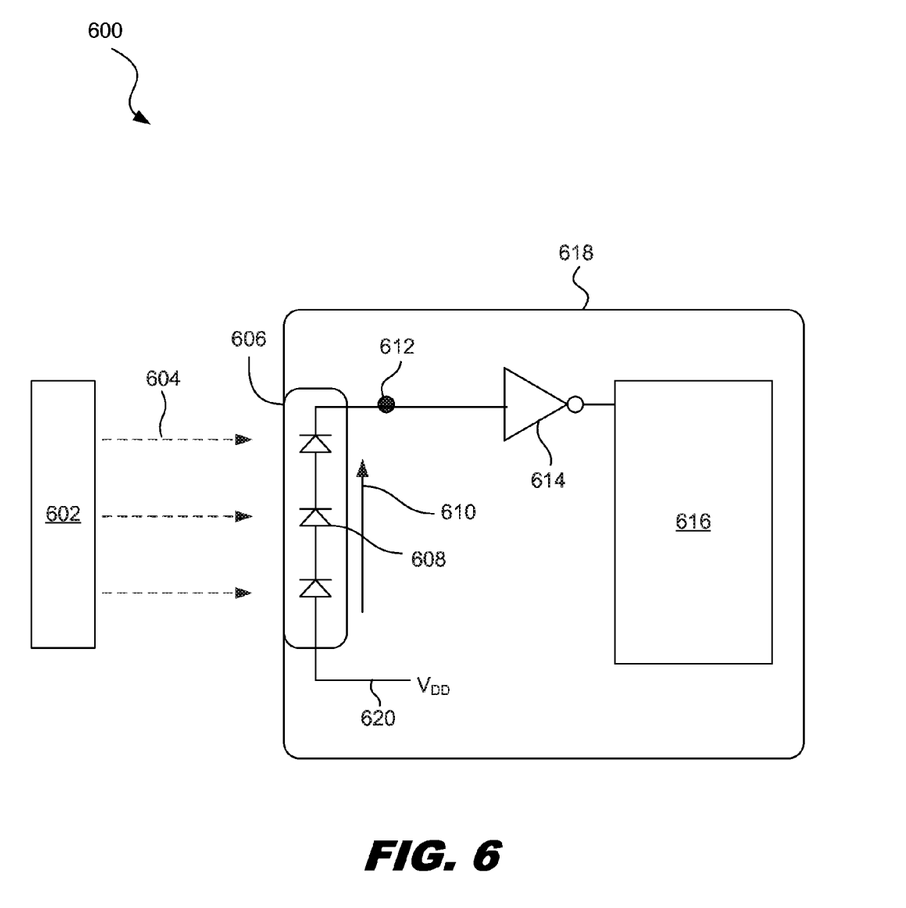
FIG. 6 is a diagram showing an illustrative integrated circuit allowing for contactless testing using optics, according to one example of principles described herein.

FIG. 6 is a diagram showing an illustrative integrated circuit allowing for contactless testing using optics. According to the present example, the optical contactless testing system 600 includes a light transmitter 602 to produce an optical beam 604. The optical beam may have a signal embedded therein. The optical beam 604 is received by a testing pad 606 that includes a number of photo-sensitive diodes 608. The photo-sensitive diodes 608 are connected to a node 612 at an input of a digital inverter 614. The output of the digital inverter 614 is connected to digital circuitry 616 within the integrated circuit 618.

The optical transmitter 602 may project a signal in a manner similar to the electron beam transmitter (102, FIG. 1). By turning the optical beam 604 on and off, the optical beam can be used to transmit a signal to the testing pad 606. The testing pad 606 includes a number of photo-sensitive diodes 608 configured to receive the optical beam.

Photo-sensitive diodes convert energy in the form of photons to electrical energy. Specifically, the photons that imping on the active regions of the photo sensitive diodes 608 push electrons from the valence band into the conduction band, thus causing the flow of electricity. The electrons will flow toward the positive voltage supply 620, thus causing an electric current 610 to flow away from the positive voltage supply 620. This will change the voltage at node 612. This change in voltage will trip the inverter to produce a high or low signal. Thus, the signal embedded within the optical beam is extracted and provided to the digital circuitry 616.

Figure 7:
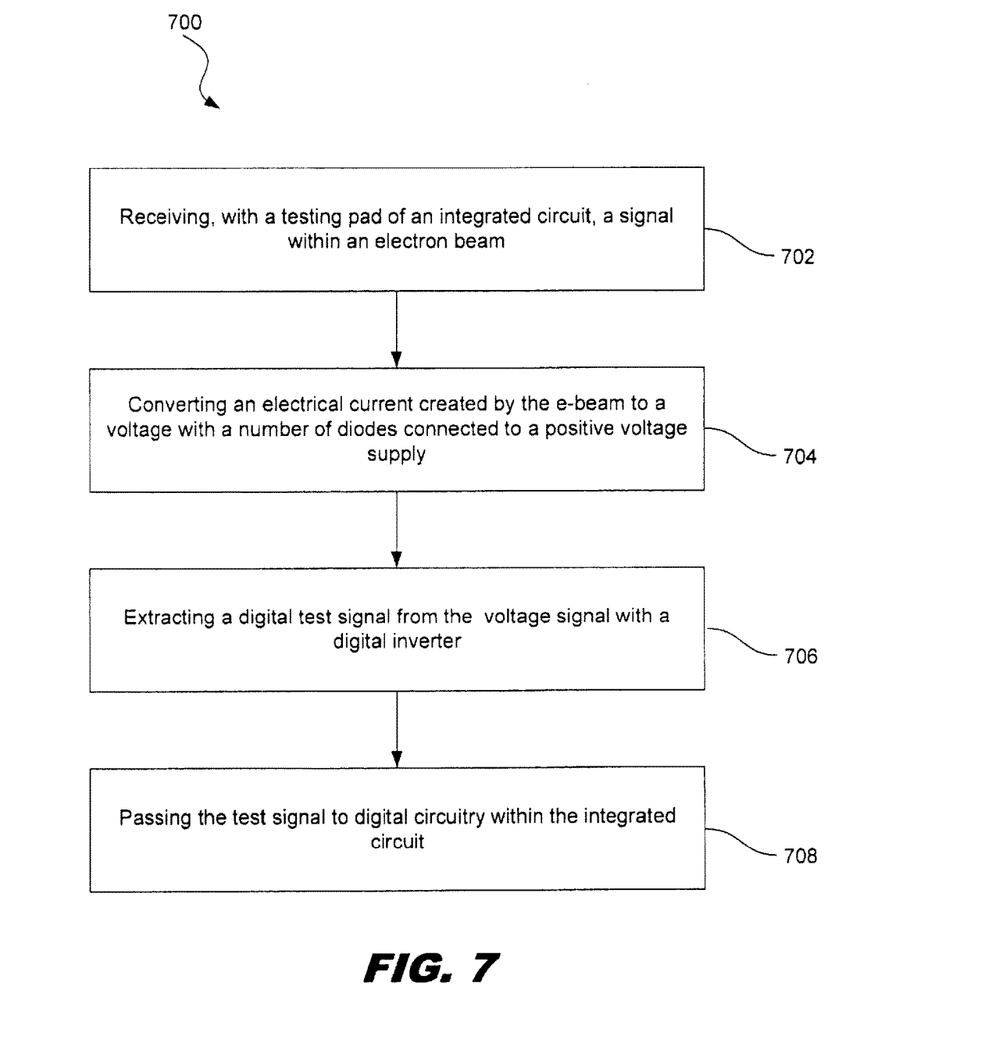
FIG. 7 is a flowchart showing an illustrative method for contactless testing, according to one example of principles described herein.

FIG. 7 is a flowchart showing an illustrative method for contactless testing, according to one example of principles described herein. According to certain illustrative examples, the method 700 includes a step for receiving 702, with a testing pad of an integrated circuit, a signal within an electron beam. The method 700 further includes a step for converting 704 an electrical current created by the e-beam to a voltage with a number of diodes connected to a positive voltage supply. The method 700 further includes a step for extracting 706 a digital test signal from the voltage signal with a digital inverter. The method 700 further includes a step for passing 708 the test signal to digital circuitry within the integrated circuit.

According to certain illustrative examples, a method for performing contactless signal testing includes receiving, with a testing pad of an integrated circuit, a signal within an electron beam. The method further includes converting, with a number of diodes connected to a positive voltage supply, an electrical current signal created by the electron beam to a voltage signal. The method further includes extracting, with a digital inverter, a test signal from the voltage signal and passing the test signal to digital circuitry within the integrated circuit.

According to certain illustrative examples, an integrated circuit device having contactless testing capability includes a testing pad to receive an electron beam having a signal embedded therein, a number of diodes connected between the testing pad and a positive voltage supply, the diodes to convert an electric current induced by the electron beam to a voltage, a digital circuit component to extract a digital test signal from the signal based on a voltage level of the number of diodes.

According to certain illustrative examples, an integrated circuit device having contactless testing capability includes a testing pad comprising a number of photo-sensitive devices that produce an electric current in response to an optical beam, a current-to-voltage structure to convert the electric current from the photo-sensitive devices to a voltage, and a digital circuit component to extract a digital test signal embedded in the optical beam based on a voltage level output by the current-to-voltage structure.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for performing contactless signal testing, the method comprising:
   receiving, with a testing pad of an integrated circuit, a signal within a beam;
   converting, with a number of diodes connected to a positive voltage supply, an electrical current signal created by the beam to a voltage signal, wherein the number of diodes includes a diode stack of multiple diodes; and
   extracting, with a digital inverter, a test signal from the voltage signal.

2. The method of claim 1, wherein a frequency of the signal is set by an on and off period of the beam.

3. The method of claim 1, wherein the number of diodes in the diode stack of multiple diodes is within a range of 3-6.

4. The method of claim 1, wherein the testing pad corresponds to a bonding pad.

5. The method of claim 1, further comprising, with a number of additional testing pads on the integrated circuit, receiving a number of additional independent signals.

6. The method of claim 5, wherein a total number of testing pads on the integrated circuit is less than a total number of bonding pads.

7. The method of claim 1, wherein the test signal is a time-division multiplexed signal.

8. The method of claim 7, further comprising, temporarily storing the time-division multiplexed signal in a memory of the integrated circuit.

9. The method of claim 8, further comprising, de-multiplexing the multiplexed signal with a de-multiplexing circuit of the integrated circuit before passing the test signal to the digital circuitry.

10. The method of claim 1, wherein the testing pad is within a size range of about 0.80-1.20 square micrometers.

11. An integrated circuit device having contactless testing capability, the integrated circuit comprising:
    a testing pad to receive a beam having a signal embedded therein;
    a number of diodes connected between the testing pad and a positive voltage supply, the diodes to convert an electric current induced by the beam to a voltage, wherein the number of diodes includes a diode stack of multiple diodes; and
    a digital circuit component to extract a digital test signal from the signal based on a voltage level of the number of diodes.

12. The integrated circuit device of claim 11, wherein the testing pad is also a bonding pad.

13. The integrated circuit device of claim 11, wherein the testing pad is separate from a bonding pad and the testing pad and bonding pad connect to the same circuit path within the integrated circuit.

14. The integrated circuit device of claim 11, wherein the number of diodes in the diode stack having a number of diodes within a range of 3 and 6.

15. The integrated circuit device of claim 11, further comprising additional testing pads, each of the additional testing pads corresponding to one of a multiple of bonding pads.

16. The integrated circuit device of claim 11, further comprising:
    a memory to temporarily store a time-division multiplexed signal; and
    a de-multiplexer to de-multiplex a signal stored in the memory.

17. The integrated circuit device of claim 11, wherein the testing pad is within a size range of about 0.80-1.20 square micrometers.

18. An integrated circuit device having contactless testing capability, the integrated circuit comprising:
    a testing pad comprising a number of photo-sensitive devices that produce an electric current in response to an optical beam;
    a current-to-voltage structure to convert the electric current from the photo-sensitive devices to a voltage, the current-to-voltage structure comprising a diode stack of multiple diodes; and
    a digital circuit component to extract a digital test signal embedded in the optical beam.

19. The integrated circuit device of claim 18, wherein the testing pad corresponds to a bonding pad of the integrated circuit.

20. The integrated circuit device of claim 18, further comprising:
    a memory to temporarily store a time-division multiplexed signal embedded within the optical beam; and
    a de-multiplexer to de-multiplex the time-division multiplexed signal stored in the memory.

* * * * *